(12) United States Patent
Chan et al.

(10) Patent No.: US 7,741,165 B2
(45) Date of Patent: *Jun. 22, 2010

(54) POLYCRYSTALLINE SIGE JUNCTIONS FOR ADVANCED DEVICES

(75) Inventors: Kevin Kok Chan, Staten Island, NY (US); Robert J. Miller, Yorktown Heights, NY (US); Erin C. Jones, Corvallis, OR (US); Atul Ajmera, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 64 days.

This patent is subject to a terminal disclaimer.

(21) Appl. No.: 12/118,776

(22) Filed: May 12, 2008

(65) Prior Publication Data

US 2008/0248635 A1    Oct. 9, 2008

Related U.S. Application Data

(60) Continuation of application No. 11/522,623, filed on Sep. 18, 2006, now Pat. No. 7,387,924, which is a division of application No. 10/851,821, filed on May 21, 2004, now Pat. No. 7,135,391.

(51) Int. Cl.
*H01L 21/336* (2006.01)
*H01L 21/8234* (2006.01)

(52) U.S. Cl. .................... 438/197; 257/E21.435
(58) Field of Classification Search .......... 257/E21.435; 438/197

See application file for complete search history.

(56) References Cited

U.S. PATENT DOCUMENTS

| 5,101,247 | A | | 3/1992 | Ozturk | 257/410 |
| 5,246,886 | A | | 9/1993 | Sakai | 438/488 |
| 5,250,452 | A | | 10/1993 | Ozturk | 438/301 |
| 5,571,744 | A | | 11/1996 | Demirlioglu | 438/217 |
| 5,646,073 | A | | 7/1997 | Grider | 438/301 |
| 5,818,100 | A | | 10/1998 | Grider | 257/616 |
| 6,117,750 | A | * | 9/2000 | Bensahel et al. | 438/478 |
| 6,872,626 | B1 | * | 3/2005 | Cheng | 438/299 |
| 7,387,924 | B2 | * | 6/2008 | Chan et al. | 438/197 |

* cited by examiner

*Primary Examiner*—Asok K Sarkar
(74) *Attorney, Agent, or Firm*—George Sai-Halasz

(57) ABSTRACT

A structure and method of fabrication for MOSFET devices with a polycrystalline SiGe junction is disclosed. Ge is selectively grown on Si while Si is selectively grown on Ge. Alternating depositions of Ge and Si layers yield the SiGe junction. The deposited layers are doped, and subsequently the dopants outdiffused into the device body. A thin porous oxide layer between the polycrystalline Ge and Si layers enhances the isotropy of the SiGe junctions.

12 Claims, 2 Drawing Sheets

POLYCRYSTALLINE SIGE JUNCTIONS FOR ADVANCED DEVICES

CROSS REFERENCE TO RELATED APPLICATIONS

This application is a continuation of application Ser. No. 11/522,623, filed Sep. 18, 2006, which application in turn is a divisional of application Ser. No. 10/851,821, filed May 21, 2004, now U.S. Pat. No. 7,135,391 issued Nov. 14, 2006. Both parent applications are incorporated herein by reference in their entirety.

FIELD OF THE INVENTION

The present invention relates to the field of integrated circuits and methods of their manufacturing. More particularly, the present invention relates to advanced field effect semiconductor devices that are in need of shallow, highly conductive junctions.

BACKGROUND OF THE INVENTION

Today's integrated circuits include a vast number of devices. Smaller devices are key to enhance performance and to improve reliability. As MOSFET (Metal Oxide Semiconductor Field-Effect-Transistor, a name with historic connotations meaning in general an insulated gate Field-Effect-Transistor) devices are being scaled down, the technology becomes more complex. There is great difficulty in maintaining performance improvements for devices of deeply submicron generations. Many avenues are being explored for keeping device performance improvements on track. Along the path of seeking ever higher device performance, downscaling of the MOSFET devices is the established guiding principle.

Downscaling dimensions naturally leads to shallower and lower doped device (source and drain) junctions, thereby increasing the parasitic resistance of the device. This happens at a time when performance dictates exactly the opposite, namely the reduction of parasitic resistance of junctions, especially that of the source junction. Spreading resistance, junction extension edge resistance, contact resistance at silicon and metal silicide interfaces, are all components of the parasitic resistance of junctions. To reduce these resistances, abrupt dopant profiles and high electrical activation are required, all the while maintaining the shallow junction profiles.

Usual techniques of the art for obtaining shallow junctions involve the implantation of the necessary dopants, such as boron (B), arsenic (As), phosphorous (P), and others, in a high dosage and at ultra-low energies, followed by a spike-Rapid Thermal Annealing (spike-RTA) to activate these dopants. However, the high thermal energy of spike-RTA annealing results in high defect generation in junctions, resulting in fast dopants diffusion through defects. As a consequence, the junctions are no longer shallow and also become electrically leaky.

SUMMARY OF THE INVENTION

In view of the problems discussed above, this invention discloses a method for forming a device junction with high conductivity, low contact resistance, shallow profile, and sharp edge. This disclosure contemplates of replacing the traditional source/drain junction material, which is the single crystal device body material, with a polycrystalline material. The dopant in the polycrystalline material achieves fast diffusion through the grain boundaries, and with proper annealing condition the dopant also forms a sharp profile in the channel region and the device body in general.

Accordingly, this invention teaches a MOSFET device structure having a junction containing polycrystalline silicon-germanium (SiGe). The invention also teaches the method for fabricating such a polycrystalline SiGe containing junction. The value of the SiGe polycrystalline junction rests on two basic concepts. First, the fast dopant diffusion along grain boundaries. Second, the higher dopant solid solubility in Ge relative to that of Si.

The fabrication method is preferably based on the chemical vapor deposition (CVD) process. For achieving preferred results and for the simplicity of the fabrication process, the polycrystalline junctions have to be grown, or deposited, in a selective manner. However, polycrystalline Si, or polycrystalline Si alloys, are not selective to dielectrics. To obtain selectivity against any dielectric, first Ge nano-crystals, or seeds, which are selective to dielectrics are being grown on the preferred Si regions. Then, after the polycrystalline Ge has been grown on preferred Si regions, one can switch to Si deposition where Si nuclei grow preferentially faster on the Ge seeds than on Si because the Ge—H bonds are weaker than Si—H bonds. Si nuclei also will not grow on dielectrics as fast as on the Ge seeds since on dielectrics Si has a longer nucleation time. After depositing a thin layer of polycrystalline Si one switches back to Ge. These steps are then repeated: alternatingly growing Ge nuclei and Si nuclei, whereby the technique achieves SiGe polycrystalline growth in a selective manner.

The invention further provides a method for forming a highly isotropic polycrystalline phase of SiGe alloy by having a noncontinuous porous oxide, typically in the range of 0.2 nm thickness, grown in the initial stage of the successive Si poly depositions. This porous oxide helps the Si crystal grains to be misoriented relative the Ge seeds.

There have been several attempts to achieve similar results in the prior art. For instance, U.S. Pat. Nos. 5,818,100 and 5,646,073 to Grider teach a method for selectively forming polycrystalline Si over single crystal Si, but they do not teach the present invention. In U.S. Pat. No. 5,571,744 to Demirlioglu, a method is disclosed to diffuse dopants into junctions from polycrystalline SiGe, but this patent does not teach the present invention.

BRIEF DESCRIPTION OF THE DRAWINGS

These and other features of the present invention will become apparent from the accompanying detailed description and drawings, wherein.

DETAILED DESCRIPTION OF THE INVENTION

FIG. 1 shows a schematic cross sectional view of a MOSFET device with polycrystalline SiGe junctions. The MOSFET device is hosted in a Si based material 110. In microelectronics technology the material that has progressed the farthest in miniaturization is Si. Silicon based materials are various alloys of Si in the same basic technological content as Si. One such Si based material of importance for microelectronics is the single crystal silicon-germanium alloy. In the context of this invention the term Si based material, if Ge is the alloying material, refers to compounds with less than about 50% of Ge. The term of hosting a device means that the critical part of the device, that which is mainly sensitive to carrier properties, such as the channel 102 of a MOSFET, is residing in the hosting material. Typically, the material 110 hosting the MOSFET device is essentially Si.

Figure 1A:
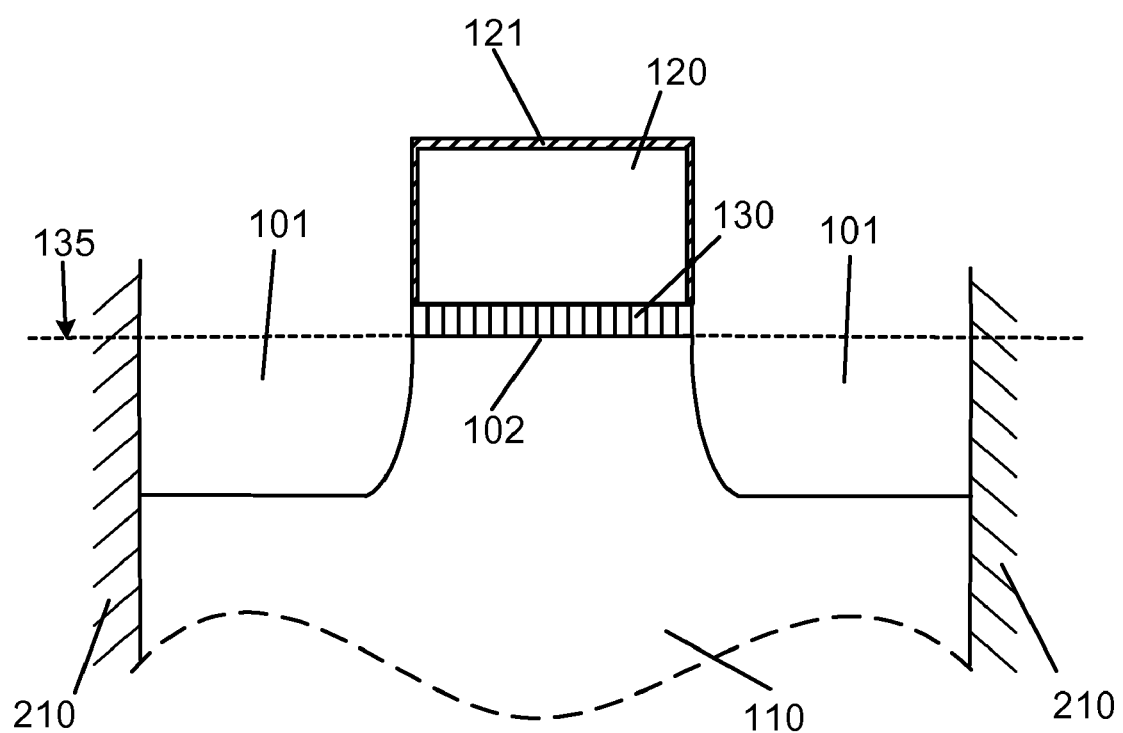
FIG. 1 shows a schematic cross sectional view of a MOSFET device with polycrystalline SiGe junctions.
Figure 1B:
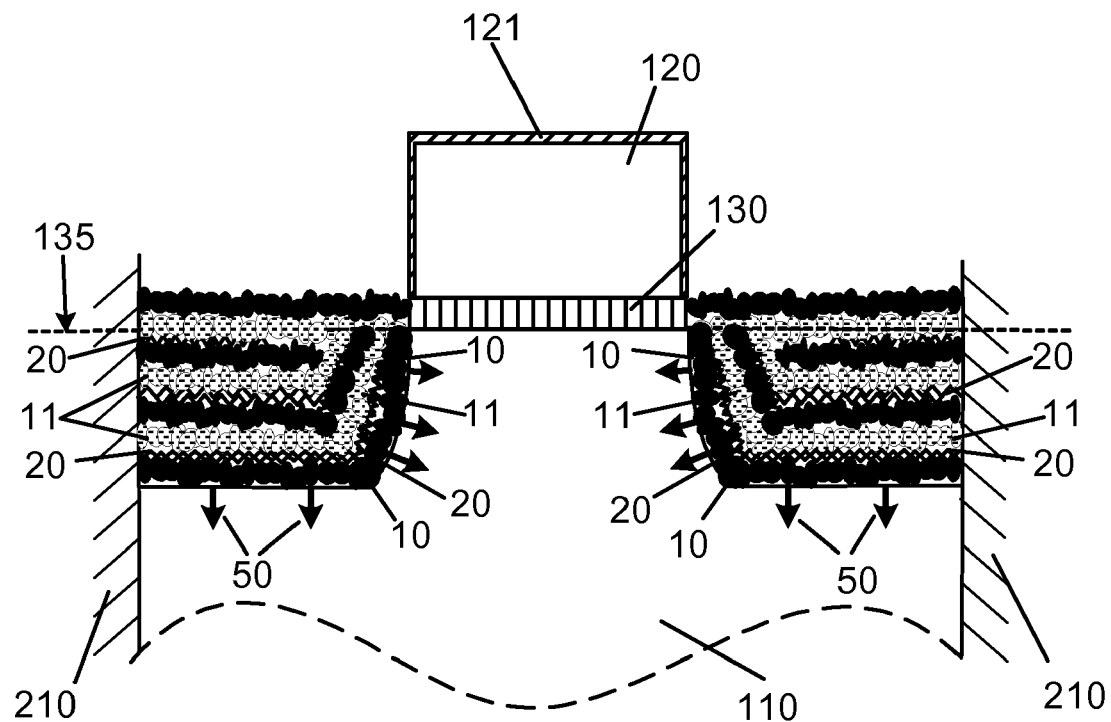

FIG. 1 shows the MOSFET device at two stages of fabrication. In FIG. 1A a preparatory stage is shown, while FIG. 1B shows the device with the disclosed steps already executed, where the junctions 101 are made up of polycrystalline SiGe, or more specifically, of alternating layers of polycrystalline Ge 10 and polycrystalline Si 11.

Processing of the MOSFET follows fabrication methods known in the art up to, and following the steps of this disclosure. FIG. 1A shows the result of such known fabrication methods with the exception of the junctions 101. The present invention deviates from the known art of device processing in the step of removing a volume of the Si based material 110 at the location of the junction 101, in effect leaving a void in the body 110. Such a removal of body material 110 from the junction site 101 can be done with any of the known methods in the art for material removal, such as reactive ion etching (RIE). In FIG. 1 the source and the drain are not distinguished from one another, consequently a single indicator number, 101, is being used for both junction locations. The dotted line 135 indicates the surface plane of the device where the gate insulator 130 interfaces with the channel 102. This plane 135 is the usual natural plane of the top of the body material 110. FIG. 1A schematically indicates further standard parts of a MOSFET device. These are the gate 120, and an isolation structure 210, well known in the art, which isolates devices from one another. Typically the gate 120 at this stage of the fabrication, is surrounded by an insulator 121. This insulator 121 may be made of a single material, or it can be made of more than one material. For instance, it may not consist of the same material on the sides of the gate and on the top of the gate, and it also may have been produced at different stages of the fabrication process. What kind of insulator surrounds the gate, or even if a gate is present at this stage of the fabrication process is not significant from the invention's point of view. What matters is that at this stage of fabrication, as shown on FIG. 1A, the only place where a Si based material is exposed is in the junction 101, where the single crystal Si based material 110 is exposed after the removal of the Si based material from the junctions. In FIG. 1A the device fabrication progressed to the point of having produced a so called first surface. This first surface is such that it has at least one first region where the Si based single crystal is exposed. This first region is the exposed surface of the hollow junction. In an exemplary embodiment the Si based material 110 is essentially Si.

Figure 2:
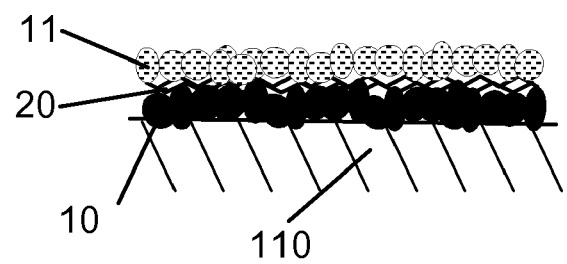
FIG. 2 shows a schematic cross sectional view of the order in which the polycrystalline layers are deposited.

FIG. 2 shows a schematic cross sectional view of the order in which the polycrystalline layers are being deposited. First, a polycrystalline Ge 10 is deposited over a Si based single crystal material 110 by CVD, using germanate ($GeH_4$) as precursor. During such a CVD process Ge will not deposit, or deposit at a much slower rate over an insulator in comparison to the rate at which it deposits onto Si. For instance, for the case of an $SiO_2$ insulator layer the following successive reactions may take place: $Ge+SiO_2 \rightarrow GeO_2+Si$; and $GeO_2+Ge \rightarrow 2GeO$: the Ge will not stay over an oxide surface because GeO sublimates when the temperature is over about 700° C. Alternatively, the CVD precursor in the Ge deposition may be $GeH_2Cl_2$, or it can be an admixture of $GeH_4$ and $GeH_2Cl_2$. Also the Ge precursor may be part of a gas mixture, which gas mixture may also contain HCl, since HCl promotes selectivity. In a an exemplary embodiment the polycrystalline Ge deposition typically lasts for a few seconds.

The CVD deposition of polycrystalline Ge over the first surface, which first surface is such that it has a single crystal Si based material exposed first region, will yield a polycrystalline Ge layer 10 over this first region. The crystal grain sizes of the polycrystalline Ge 10 range in diameter from about 1.5 nm to 15 nm. The thickness of the polycrystalline Ge 10 layer is typically between about 2 nm and 15 nm. The described CVD Ge deposition process yields Ge deposition over exposed Si based material regions, irrespective whether such regions are of a single crystal or essentially of a polycrystalline material.

The process of selective polycrystalline Ge 10 formation over the single crystal Si based material 110, as shown in FIG. 2, and in the junction void of FIG. 1B, yields a second surface. The difference between the first surface and the second surface is that now the first region is occupied by the polycrystalline Ge 10, instead of the exposed single crystal Si based material 110.

Polycrystalline Si 11 can now be deposited by CVD over the second surface, since Si preferentially forms over the first region of exposed polycrystalline Ge. The polycrystalline Si 11 is deposited by CVD using silene ($SiH_4$) as precursor. In this process Si will not deposit, or deposit at a much slower rate, over insulators in comparison to the rate at which it deposits onto Ge. Alternatively, the CVD precursor in the Si deposition may be $SiH_2Cl_2$, or it can be an admixture of $SiH_4$ and $SiH_2Cl_2$. Also the Si precursor may be part of a gas mixture, which gas mixture may also contain HCl, since HCl promotes selectivity. In a an exemplary embodiment the temperature of the CVD process during the Si deposition is about between 600° C. and 750° C., with the Si deposition lasting for about 20 to 60 seconds.

The CVD deposition of Si over the second surface, which second surface is such that it has an exposed polycrystalline Ge first region, will yield an polycrystalline Si layer 11 over this first region. The diameter of the crystal grain sizes of the polycrystalline Si 11 range from about 1.5 nm to 15 nm. The thickness of the polycrystalline Si 11 layer is typically between about 2 nm and 15 nm. The described CVD Si deposition process yields selective Si deposition over exposed Ge regions, irrespective whether such regions are of a single crystal material or essentially of a polycrystalline material.

The process of selective polycrystalline Si 11 formation over the polycrystalline Ge 10 layer, as shown in FIG. 2 and in the junction void of FIG. 1B, yields a third surface. The difference between the second surface and the third surface is that now the first region is occupied by the polycrystalline Si 11, instead of the polycrystalline Ge 10.

The deposition of polycrystalline Ge over Si, and the deposition of polycrystalline Si over Ge has been experimentally confirmed using an Atomic Force Microscopy (AFM) in a technique known by the art.

In building up a SiGe polycrystalline layer of the desired thickness one is repeating the steps of the Si deposition onto the second surface and the Ge acknowledgment onto the third surface, as many times as needed. The thin alternating layers of polycrystalline Ge 10 and Si 11 give the desired junction properties for MOSFET device fabrication, such as high conductivity and high dopant diffusion.

During the process of alternating between Ge and Si deposition, in a an exemplary embodiment one can also deposit a thin porous oxygen containing layer 20 in the initial period of the Si layer growth. This thin porous oxide layer 20 serves to additionally misorient the Si crystal grains relative to the Ge crystal grains. In this manner the resulting SiGe layer becomes more isotropic, which has advantages for both the conductivity and the dopant diffusion properties of the junction.

The deposition of the porous oxygen containing layer 20 is accomplished by adding an oxygen carrying gas, for instance simply $O_2$, to the Si precursor, possibly mixed with HCl, in the initial stages of the Si deposition step. The porous oxide layer 20 has typically a thickness of only between about 0.1 nm and 1 nm. In FIGS. 1B and 2 this porous oxide layer 20 is shown with crisscrossing lines, indicating porousness and thinness.

FIG. 1B shows the MOSFET device after the steps of the present invention have been carried out, and it has a novel junction structure involving polycrystalline SiGe. Following the state of device processing which is schematically shown in FIG. 1A, the void 101 left after the Si based material removal is filled with alternating layers of polycrystalline Ge 10 and polycrystalline Si 11. The first Ge layer 10 is the one interfacing with the Si based material body 110. As FIG. 1B indicates, the selectively deposited layers likely cover the exposed surfaces conformally. In an exemplary embodiment, before the Si layer 11 is deposited it is preceded by the selective deposition of a porous oxygen containing layer 20. These successive steps of the disclosed method have been verified using scanning electron microscopy (SEM), in a technique known by the art.

In an exemplary embodiment the Ge 10 and the Si 11 layers are being doped during deposition with a technique called in situ doping, which is known in the art. In a typical application when the fabricated MOSFET is a PMOS, the in situ dopant is boron (B). After having finished the SiGe junction formation, the dopant is made to diffuse 50 into the Si based body material 110. This outdiffusion is indicated in FIG. 1B with the short arrows 50. Conditions for this outdiffusion step in an exemplary embodiment are: approximately 1000° C. for 1 sec of RTA. With the rapid diffusion of the dopant out of the polycrystalline SiGe and into the body material one obtains the desired shallow high conductivity junctions. In an exemplary embodiment both the source and the drain junctions are fabricated in the described manner. However, if one desires, the invention can be applied to only one junction, for instance to the source junction. The figures showing both source and drain junctions made of SiGe polycrystalline material should not be interpreted restrictively.

The height to which the voids are filled with polycrystalline SiGe depends on the specific needs of the embodiment as applied to any particular device structure. In an exemplary embodiment the polycrystalline SiGe may rise above the natural surface plane of the device 135, possibly facilitating subsequent fabricating steps known in the art, such as the self-aligned-silicidation of the junctions.

Many modifications and variations of the present invention are possible in light of the above teachings, and could be apparent for those skilled in the art. The scope of the invention is defined by the appended claims.

We claim:

1. A method for forming a junction for a MOSFET device in a Si based material, comprising:
   removing a volume of said Si based material at the site of said junction; and
   filling said volume with a SiGe polycrystalline material.

2. The method of claim 1, further comprising:
   diffusing dopants from said SiGe polycrystalline material into said Si based material.

3. The method of claim 2, wherein said dopant is selected to be boron (B).

4. The method of claim 1, wherein said filling is executed by deposition of alternating polycrystalline layers of Ge and Si.

5. The method of claim 4, wherein said deposition is done by chemical vapor deposition.

6. The method of claim 5, wherein said polycrystalline layers of Ge and Si are in situ doped during said deposition.

7. The method of claim 4, wherein said filling further comprises deposition of a porous oxide layer on at least one of said polycrystalline Ge layers.

8. The method of claim 4, wherein each of said polycrystalline Ge layers is having crystals with a diameter in the range from about 1.5 nm to 15 nm.

9. The method of claim 4, wherein each of said polycrystalline Ge layers is deposited to a thickness of between about 2 nm to 15 nm.

10. The method of claim 4, wherein each of said polycrystalline Si layers is having crystals with a diameter in the range from about 1.5 nm to 15 nm.

11. The method of claim 4, wherein each of said polycrystalline Si layers is deposited to a thickness of between about 2 nm to 15 nm.

12. The method of claim 1, wherein said Si based material is chosen to be essentially a Si material.

* * * * *